United States Patent
Brechignac et al.

(10) Patent No.: US 7,327,005 B2
(45) Date of Patent: Feb. 5, 2008

(54) OPTICAL SEMICONDUCTOR PACKAGE WITH INCORPORATED LENS AND SHIELDING

(75) Inventors: Remi Brechignac, Grenoble (FR); Juan Exposito, St. Nazaire les Eymes (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/478,178

(22) PCT Filed: May 17, 2002

(86) PCT No.: PCT/FR02/01689

§ 371 (c)(1),
(2), (4) Date: Jun. 28, 2004

(87) PCT Pub. No.: WO02/095796

PCT Pub. Date: Nov. 28, 2002

(65) Prior Publication Data

US 2004/0217454 A1    Nov. 4, 2004

(30) Foreign Application Priority Data

May 18, 2001    (FR) .................................. 01 06553

(51) Int. Cl.
*H01L 31/0203*    (2006.01)
(52) U.S. Cl. ...................... 257/434; 257/432; 257/433; 257/435; 257/E31.117
(58) Field of Classification Search ........ 257/431–435, 257/680, 678, 99–103, E31.117
See application file for complete search history.

(56) References Cited

U.S. PATENT DOCUMENTS

| | | | | |
|---|---|---|---|---|
| 5,122,861 A * | 6/1992 | Tamura et al. | ............... | 257/434 |
| 5,150,180 A * | 9/1992 | Yama | .......................... | 257/680 |
| 5,274,456 A * | 12/1993 | Izumi et al. | ................. | 348/335 |
| 5,357,056 A * | 10/1994 | Nagano | ..................... | 174/52.4 |
| 5,617,131 A * | 4/1997 | Murano et al. | ............. | 347/233 |
| 5,783,815 A * | 7/1998 | Ikeda | ....................... | 250/208.1 |
| 6,335,224 B1 * | 1/2002 | Peterson et al. | ............ | 438/114 |
| 6,384,397 B1 * | 5/2002 | Takiar et al. | ............. | 250/208.1 |
| 6,396,116 B1 * | 5/2002 | Kelly et al. | ................. | 257/432 |
| 6,428,650 B1 * | 8/2002 | Chung | ......................... | 156/250 |
| 6,476,417 B2 * | 11/2002 | Honda et al. | .................. | 257/59 |
| 6,486,467 B1 * | 11/2002 | Speckbacher et al. | .. | 250/237 G |
| 6,492,699 B1 * | 12/2002 | Glenn et al. | ................ | 257/433 |
| 6,627,872 B1 * | 9/2003 | FuKamura et al. | ......... | 250/239 |
| 6,674,159 B1 * | 1/2004 | Peterson et al. | ............ | 257/432 |
| 6,683,298 B1 * | 1/2004 | Hunter et al. | ............... | 250/239 |
| 6,727,431 B2 * | 4/2004 | Hashimoto | .................. | 174/539 |
| 6,762,796 B1 * | 7/2004 | Nakajoh et al. | ............ | 348/340 |
| 6,774,447 B2 * | 8/2004 | Kondo et al. | ............... | 257/432 |

(Continued)

*Primary Examiner*—Thao X Le
(74) *Attorney, Agent, or Firm*—Lisa K. Jorgenson; Jose Gutman; Fleit Kain Gibbons Gutman Bongini & Bianco P.L.

(57) ABSTRACT

An optical semiconductor module including an optical semiconductor component that has a front face including an optical sensor. Encapsulation, defining a cavity in which the optical component is disposed, includes external electrical connections for the optical semiconductor component, and includes a window allowing light to pass through it toward the optical sensor. An optical lens (17) is disposed in the cavity (6) between the optical sensor (10) and the window (5). A support structure (18) supports the optical lens. This optical semiconductor module may also include a shield (24).

24 Claims, 4 Drawing Sheets

U.S. PATENT DOCUMENTS

| | | | |
|---|---|---|---|
| 6,795,120 B2 * | 9/2004 | Takagi et al. | 348/294 |
| 6,825,540 B2 * | 11/2004 | Harazono et al. | 257/436 |
| 6,870,238 B2 * | 3/2005 | Exposito et al. | 257/431 |
| 6,949,808 B2 * | 9/2005 | Harazono | 257/433 |
| 2002/0158296 A1 * | 10/2002 | Kim | 257/432 |
| 2003/0094665 A1 * | 5/2003 | Harazono | 257/432 |
| 2003/0214028 A1 * | 11/2003 | Brechignac et al. | 257/706 |
| 2004/0065952 A1 * | 4/2004 | Prior | 257/724 |
| 2005/0006732 A1 * | 1/2005 | Perillat | 257/666 |
| 2005/0048692 A1 * | 3/2005 | Hanada et al. | 438/106 |

* cited by examiner

OPTICAL SEMICONDUCTOR PACKAGE WITH INCORPORATED LENS AND SHIELDING

CROSS-REFERENCE TO RELATED APPLICATIONS

This application is the National Stage of International Application No. PCT/FR02/01689 filed on May 17, 2002, which is based upon and claims priority from prior French Patent Application No. 0106553 filed May 18, 2001, the entire disclosure of which is herein incorporated by reference.

BACKGROUND OF THE INVENTION

1. Field of the Invention

The present invention relates to optical semiconductor packages.

2. Description of Related Art

Prior art optical semiconductor packages include a sealed cavity into which is fixed an optical semiconductor component whose front face includes an optical sensor; the cavity is partly delimited by a window in front of the optical sensor. Fixing a lens-carrier fitted with a lens in front of the optical sensor over the window on the outside of the cavity is also known in the art. Given cumulative manufacturing tolerances, it is obligatory to make provision adjusting the focal distance between the lens and the optical sensor. To this end the lens is fixed into a ring and the ring is screwed adjustably into a passage in the lens-carrier.

This kind of package includes many components that are complex to fabricate and necessitates adjustment of the lens, after assembly, and fixing it in the adjusted position, with the result that its fabrication cost is relatively high.

SUMMARY OF THE INVENTION

An object of the present invention is to propose an optical semiconductor package of simpler structure requiring no adjustment.

Another object of the present invention is to improve the quality of electrical signals delivered by the optical semiconductor component.

The optical semiconductor package according to the invention includes an optical semiconductor component, which has a front face including an optical sensor, and encapsulation means which delimit a cavity in which said optical component is disposed, have external electrical connection means of said optical semiconductor component, and include a window allowing light to pass through it toward said optical sensor and further includes an optical lens disposed in said cavity between said optical sensor and said window and support means (18) for supporting said lens.

According to the invention said lens support means are fixed to the front face of said optical component externally of said optical sensor.

According to the invention, a joining ring (18a) is preferably disposed between a front rim of said support means and said encapsulation means.

According to the invention, said lens support means preferably include a ring into which said lens is fixed and whose rear end is fixed to the front face of said optical component externally of said optical sensor.

According to the invention, said lens support means preferably include a joining ring disposed between the front rim of said annular ring and said encapsulation means.

According to the invention, said encapsulation means preferably include a diaphragm.

In one embodiment of the invention said encapsulation means include electrically conductive material electromagnetic shielding means which can be connected externally and are electrically insulated from said electrical connection means of said optical component.

According to the invention, said encapsulation means preferably include a support and a glazed cover fixed to a front face of said support, which delimits a cavity between them, said optical component is fixed to said support, and said support includes an external electrical connection network of said optical component.

According to another embodiment of the invention said support is in the form of a plate and said glazed cover is in the form of a cup whose peripheral rim is fixed to the front face of said plate and has an opening obstructed by said window.

According to another embodiment of the invention said support has a hollow part surrounded by an annular part and to the bottom of which said optical component is fixed and said glazed cover includes a glazed plate whose peripheral part is fixed to the front face of said annular part of said support.

According to the invention said support and said glazed cover include electrically conductive material shielding parts connected to each other in the area of the front face of said support.

According to the invention said shielding parts of said glazed cover preferably delimit a diaphragm.

According to the invention said support preferably includes an integrated electrically conductive material shielding plane under said optical component and integrated electrically conductive material shielding columns opening onto its front face and said glazed cover includes an electrically conductive material shielding part or layer electrically connected to said shielding columns of said support.

According to the invention said glazed cover is preferably fixed to said support by an electrically conductive adhesive making the electrical connection between them.

In one embodiment of the invention said glazed cover includes an electrically conductive material cup.

In another embodiment of the invention said glazed cover includes a window one face of which is at least partly covered by a shielding layer of an electrically conductive material except for an opening in front of said optical sensor.

In another embodiment of the invention said glazed cover includes an electrically conductive material plate which has an opening in front of said optical sensor and obstructed by a window.

BRIEF DESCRIPTION OF THE DRAWINGS

The present invention will be better understood after studying various optical semiconductor packages described by way of non-limiting example and shown in the drawings, in which.

DETAILED DESCRIPTION OF PREFERRED EMBODIMENTS

Figure 1:
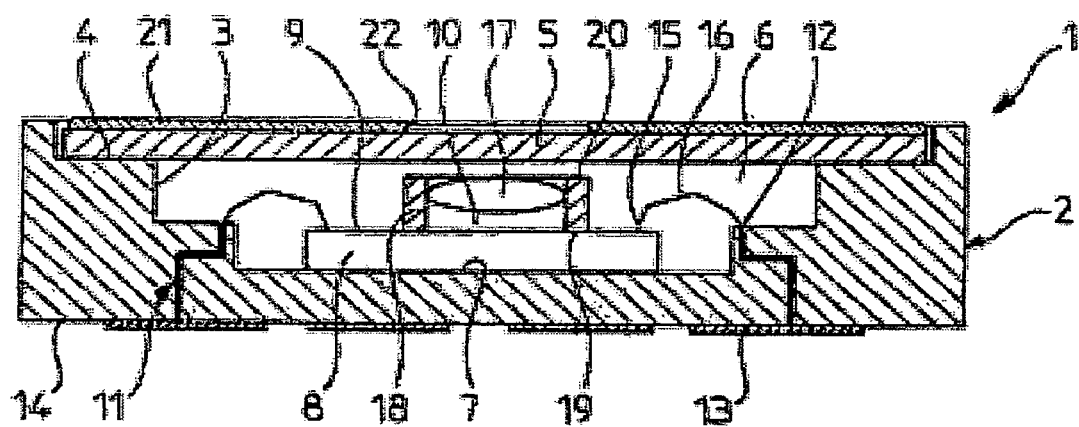
FIG. 1 shows a first optical semiconductor package in accordance with the present invention in section.
Figure 2:
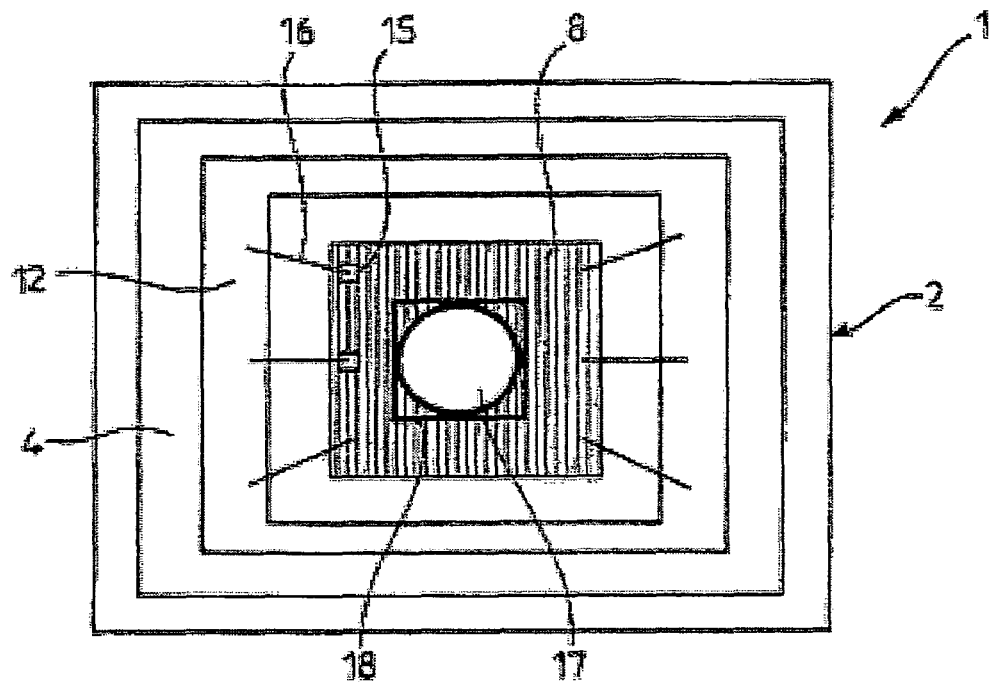
FIG. 2 is a top view of the optical semiconductor package shown in FIG. 1 with the window removed.
Figure 3:
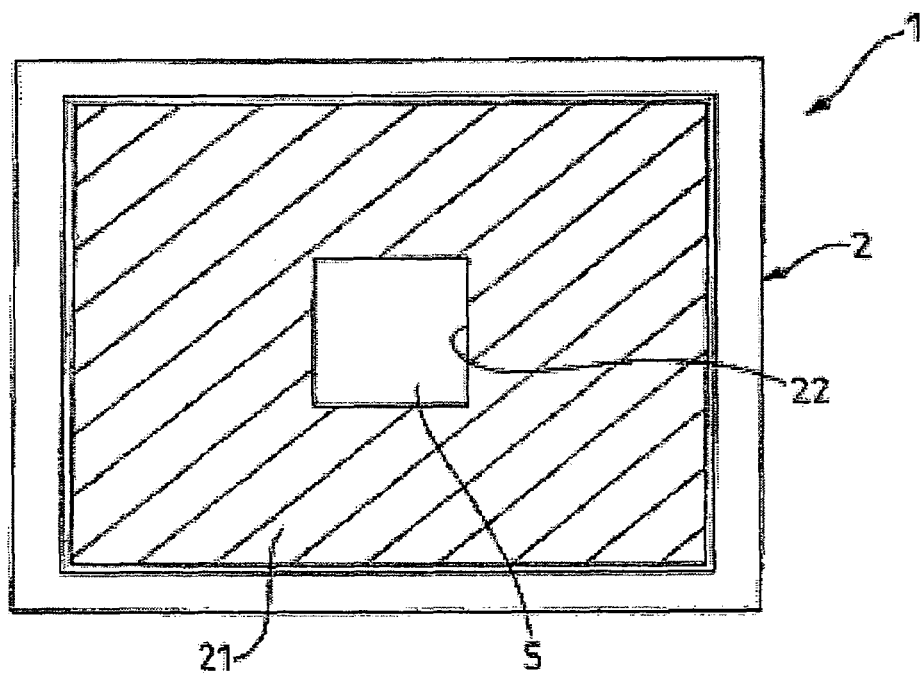
FIG. 3 is a top view of the optical semiconductor package shown in FIG. 1.

FIGS. 1 to 3 show an optical semiconductor package 1 which includes a flat parallelepiped-shaped support 2 with a recess 3 in one face; the support 2 therefore has an annular front face 4 around the recess.

The optical package 1 further includes a glazed cover consisting of a transparent window 5; the periphery of the latter's rear face bears against and is fixed to the front face 4 of the support 2, for example by means of an adhesive. The support 2 and the window 5 therefore delimit a sealed encapsulation cavity 6.

An optical semiconductor component 8 is disposed in the cavity 6. A rear face of the optical component 8 is fixed to the back 7 of the recess 3 in the support 2, for example by means of an adhesive, and its front face 9, which is at a distance from and parallel to the window 5, has in its central part an optical sensor 10 covering a square area, for example.

The support 2 is made from a multilayer ceramic or organic material, for example, and includes an internal electrical interconnection network 11. The network 11 interconnects internal terminals 12 disposed and arranged on the wall of the recess 3 in the support 2, at a distance from and at the periphery of the optical component 8, and external terminals 13 for external electrical connections disposed and arranged on the rear face 14 of the support 2.

The optical component 8 has front electrical connection terminals 15 on its front face 9, near its periphery and at a distance from the optical sensor 10.

The internal terminals 12 of the support 2 and the front terminals 15 of the optical component 8 are connected by electrical wires 16 whose ends are soldered to the terminals. The optical component 8 can thus be connected to an external electrical unit through the support 2, via the network 11 and the electrical wires 16.

The package 1 further includes an optical lens 17 disposed in the cavity 6, between the window 5 and the optical sensor 10.

The lens 17 is fixed into a ring 18 which is cylindrical, for example, whose axis is perpendicular to the front face 9 of the optical component 8, and which has an annular rim 19 at its rear end fixed to the front face 9, for example by means of an adhesive, between the area constituting the optical sensor 10 and the front terminals 15; an annular rim 20 at the front end of the ring 18 is near or in contact with the window 5.

The front face of the window 5 is covered with an opaque layer 21 with an aperture 22 in the part thereof in front of the lens 17, to constitute a diaphragm.

Thus external light passes through the diaphragm 22, the corresponding part of the window 5 and the lens 17 inside the ring 18, until it finally reaches the optical sensor 10; the optical component 8 is adapted to deliver the corresponding electrical signals to the external terminals 16 via the electrical wires 16 and the network 11 of the support 2.

The optical semiconductor package 1 can be fabricated in the following manner.

The rear face of the optical semiconductor component 8 is fixed to the back 7 of the recess 3 in the support 2 using an appropriate adhesive.

The support 2 is electrically connected to the optical component 8 by soldering the ends of the wires 16 to the terminals 12 and 15.

The ring 18 previously fitted with the lens 17 is fixed to the front face 9 of the optical component 8, by means of a suitable adhesive, so that the required position of the lens 17 relative to the optical sensor 10 is obtained directly.

Finally, the window 5 with the layer 21 is installed on the front face 4 of the support 2 and fixed thereto using a suitable adhesive.

Figure 4:
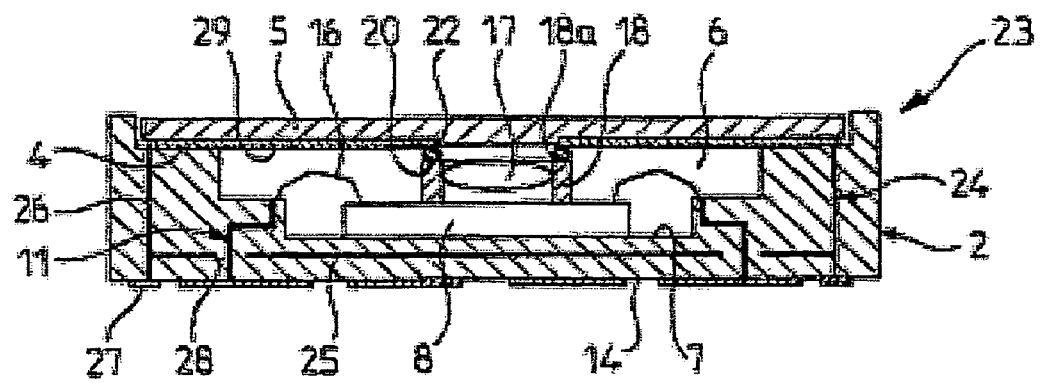
FIG. 4 shows a second optical semiconductor package in accordance with the present invention in section.
Figure 5:
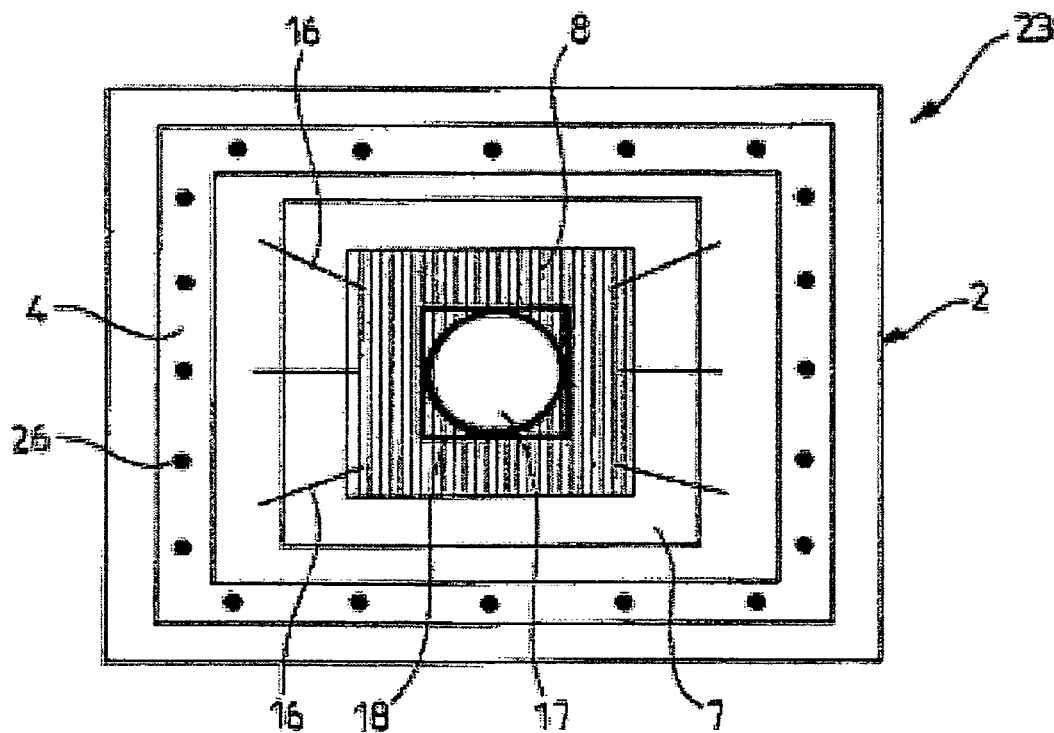
FIG. 5 is a top view of the optical semiconductor package shown in FIG. 1 with the window removed.

FIGS. 4 and 5 show an optical semiconductor package 23 that differs from the optical semiconductor package 1 described with reference to FIGS. 1 to 3 only in that it includes electromagnetic shielding means 24 electrically insulated from the electrical connection network 11 of the support 2.

To this end, the support 2 further includes an integrated electrically conductive material, for example metal, plane 25 parallel to its rear face 14 and a multiplicity of integrated electrically conductive material, for example metal, columns 26 arranged in the periphery volume of the support 2 and connected to the conductive plane 25. The conductive columns 26 open onto the front face 4 of the support 2 and at least one column opens onto the rear face 14 of the support 2 to constitute at least one external electrical connection terminal 27.

In the support 2, the integrated conductive plane 25 and the integrated conductive columns 26 are arranged so that they are not in contact with the integrated interconnection network 11. In particular, the interconnection lines of the network 11 pass through passages 28 through the conductive plane 25.

The rear face of the window 5, which faces toward the cavity 6, carries an electrically conductive material layer 29 which is opaque except in the area in front of the lens 17, to constitute the diaphragm 22; the external layer 21 of the previous example has been eliminated.

The periphery of the window 5 is advantageously fixed to the front face 4 of the support 2 using an electrically conductive adhesive so that the conductive layer 29 carried by the window 5 is electrically connected to the conductive columns 4 of the support 2.

As a result, by connecting the external terminal 27 to ground, preferably one independent of the ground of the optical component 8, the shielding means 24, consisting of the conductive plane 25, the conductive columns 26 and the conductive layer 29, constitute a cage for electromagnetically isolating the optical semiconductor component 8.

In this embodiment, a joining ring 18a is disposed around the diaphragm 22, between the front annular rim 20 of the ring 18 and the rear face of the window 5.

Figure 6:
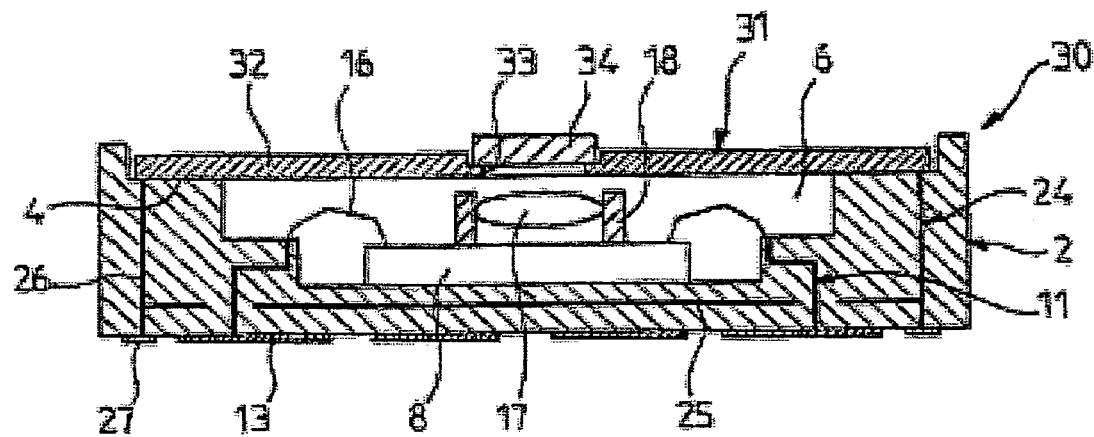
FIG. 6 shows a third optical semiconductor package in accordance with the present invention in section.

FIG. 6 shows an optical semiconductor package 30 which differs from the optical semiconductor package 23 described with reference to FIGS. 4 and 5 only in that the window 5 with the conductive layer 29 is replaced by a glazed cover 31 which includes an opaque electrically conductive material, for example metal, plate 32 which has an opening 33 in front of the lens 17 and constituting the diaphragm 22 previously cited; the opening 33 is obstructed by a transparent window 34 whose periphery is glued to the plate 32, for example.

As in the previous example, the periphery of the plate 32 is fixed to the front face 4 of the support 2 using a conductive adhesive, and is therefore electrically connected to the conductive columns 26.

Figure 7:
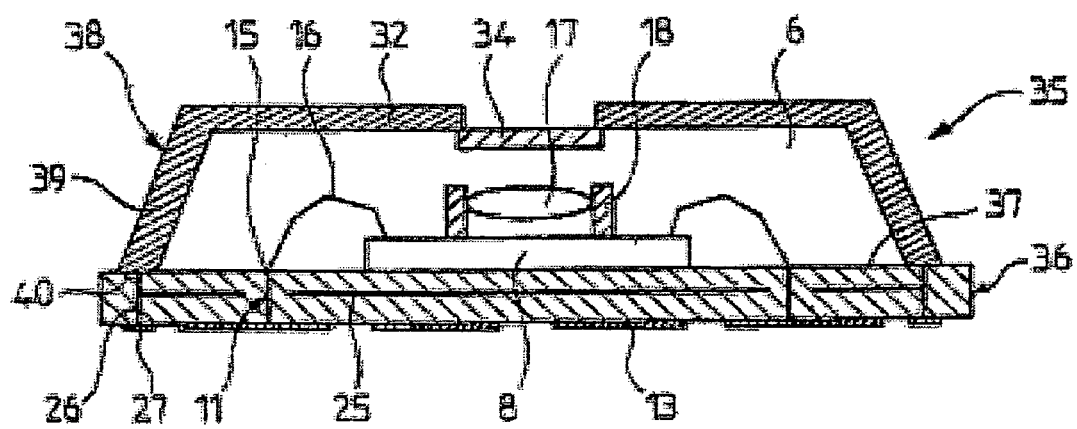
FIG. 7 shows a fourth optical semiconductor package in accordance with the present invention in section.

FIG. 7 shows a semiconductor package 35 that differs from those described in the previous examples in that its interconnection support 36, corresponding to the interconnection support 2, consists of a flat plate whose front face 37 carries the optical semiconductor component 8 and includes the internal terminals 15.

This optical package 35 includes a glazed cover 38 in the form of a cup whose rim is fixed to the front face 37 of the plate 36 to delimit the sealed cavity 6.

The bottom of the cup 38 consists of the plate 32 and the window 34 described with reference to FIG. 6 and its lateral wall 39 consists of a peripheral extension of the plate 32 whose edge 40 is fixed to the front face 37 of the plate 36 by a conductive adhesive so that it is electrically connected to the conductive columns 26 integrated into the support 36.

The present invention is not limited to the examples described hereinabove. Many different embodiments that do not depart from the scope of the invention as defined by the accompanying claims are feasible.

What is claimed is:

1. An optical semiconductor module comprising:
   an optical semiconductor component having a front face including an optical sensor and front electrical terminals;
   encapsulation means, delimiting a cavity in which the optical semiconductor component is disposed, having external electrical connection means of the optical semiconductor component, the optical sensor being carried by the encapsulation means;
   a window allowing light to pass therethrough toward the optical sensor;
   a single optical focusing lens disposed in the cavity, between the optical sensor and the window, the single optical focusing lens having a lens diameter;
   a ring for supporting the single optical focusing lens at a substantially unadjustable distance from the single optical focusing lens to the optical sensor, wherein the ring is fixed on a part of the front face of the optical component that extends between the optical sensor and the front electrical terminals, wherein the ring is carried directly by the front face of the optical sensor, wherein the ring is a different structure from, and not fixed to, the encapsulation means, and wherein the ring has a ring diameter; and
   wherein the lens diameter is approximately equal to the ring diameter.

2. The optical semiconductor module according to claim 1, wherein the encapsulation means includes a diaphragm.

3. The optical semiconductor module according to claim 1, wherein the encapsulation means includes electrically conductive material electromagnetic shielding means that can be connected externally and that is electrically insulated from the electrical connection means of the optical semiconductor component.

4. The optical semiconductor module according to claim 1, wherein the ring is fixed to the front face of the optical semiconductor component externally of the optical sensor.

5. The optical semiconductor module according to claim 1, wherein the ring includes a joining ring disposed between a front rim of the ring and the encapsulation means.

6. The optical semiconductor module according to claim 5, wherein the encapsulation means includes a diaphragm.

7. The optical semiconductor module according to claim 1, wherein the encapsulation means includes a support and a glazed cover fixed to a front face of the support, delimiting a cavity between them, the optical semiconductor component being fixed to the support, and the support including an integrated interconnection network of the optical semiconductor component.

8. The optical semiconductor module according to claim 7, wherein the support has a hollow part surrounded by an annular part and to the bottom of which the optical semiconductor component is fixed, and wherein the glazed cover includes a glazed plate whose peripheral part is fixed to the front face of the annular part of the support.

9. The optical semiconductor module according to claim 7, wherein the support is in the form of a plate and the glazed cover is in the form of a cup whose peripheral rim is fixed to the front face of the plate and has an opening obstructed by the window.

10. The optical semiconductor module according to claim 7, wherein the support and the glazed cover include electrically conductive material shielding parts connected to each other in the area of the front face of the support.

11. The optical semiconductor module according to claim 10, wherein the electrically conductive material shielding parts of the glazed cover delimit a diaphragm.

12. The optical semiconductor module according to claim 7, wherein the support includes an integrated electrically conductive material shielding plane under the optical semiconductor component and integrated electrically conductive material shielding columns opening onto the front face of the support, and the glazed cover includes an electrically conductive material shielding plate electrically connected to the integrated electrically conductive material shielding columns of the support.

13. The optical semiconductor module according to claim 7, wherein the glazed cover is fixed to the support by an electrically conductive adhesive making electrical connection therebetween.

14. The optical semiconductor module according to claim 7, wherein the glazed cover includes an electrically conductive material cup that has an opening facing the optical sensor and obstructed by the window.

15. The optical semiconductor module according to claim 7, wherein the glazed cover includes a window one face of which is at least partly covered by a shielding plate of an electrically conductive material except for an opening in front of the optical sensor.

16. The optical semiconductor module according to claim 7, wherein the glazed cover includes an electrically conductive material plate that has an opening in front of the optical sensor and obstructed by the window.

17. An electronic device comprising:
   an electronic circuit including an optical semiconductor module, the optical semiconductor module comprising:
      an optical semiconductor component having a front face including an optical sensor that includes on the front face thereof a front sensor zone and front electrodes;
      encapsulation means, delimiting a cavity in which the optical semiconductor component is disposed, having external electrical connection means of the optical semiconductor component being electrically coupled to the electronic circuit, the optical sensor being carried by the encapsulation means;
      a window allowing light to pass therethrough toward the optical sensor;

a single optical focusing lens disposed in the cavity, between the optical sensor and the window, the single optical focusing lens having a periphery; and support means in contact with the single optical focusing lens at the periphery of the single optical focusing lens for supporting the single optical focusing lens at a substantially unadjustable distance from the single optical focusing lens to the optical sensor, wherein the support means is fixed on a part of the front face of the optical sensor that extends between the front sensor zone and the front electrodes, wherein the support means is carried directly by the front face of the optical sensor, wherein the support means is a different structure from, and not fixed to, the encapsulation means, and wherein the single optical focusing lens extends across the support means.

18. The electronic device of claim 17, wherein the support means includes an annular ring into which the optical focusing lens is fixed and whose rear end is fixed to the front face of the optical semiconductor component externally of the optical sensor.

19. The electronic device of claim 17, wherein the encapsulation means includes a diaphragm.

20. The electronic device of claim 17, wherein the encapsulation means includes electrically conductive material electromagnetic shielding means that can be connected externally of the optical semiconductor component.

21. The electronic device of claim 17, wherein the support means is fixed to the front face of the optical semiconductor component externally of the optical sensor, and wherein the support means includes an annular ring into which the optical focusing lens is fixed and whose rear end is fixed to the front face of the optical semiconductor component externally of the optical sensor.

22. The electronic device of claim 17, wherein the encapsulation means includes a support and a glazed cover fixed to a front face of the support, delimiting a cavity between them, the optical semiconductor component being fixed to the support, and the support including an external electrical connection network of the optical semiconductor component and electrically coupled to the electronic circuit.

23. The electronic device of claim 22, wherein the support and the glazed cover include electrically conductive material shielding parts connected to each other in the area of the front face of the support.

24. The electronic device of claim 23, wherein the electrically conductive material shielding parts of the glazed cover delimit a diaphragm.

* * * * *